(12) United States Patent
Chung et al.

(10) Patent No.: US 10,122,173 B2
(45) Date of Patent: Nov. 6, 2018

(54) REACTIVE POWER COMPENSATOR AND METHOD OF CONTROLLING THE SAME

(71) Applicants: LSIS CO., LTD., Anyang-si, Gyeonggi-do (KR); Seoul National University R&DB FOUNDATION, Seoul (KR)

(72) Inventors: Yong Ho Chung, Anyang-si (KR); Gum Tae Son, Anyang-si (KR); Seung Ki Sul, Seoul (KR); Jae Jung Jung, Seoul (KR); Joon Hee Lee, Cheongdo-gun (KR)

(73) Assignee: LSIS CO., LTD., Anyang-si, gyeonggi-Do (KR)

( * ) Notice: Subject to any disclaimer, the term of this patent is extended or adjusted under 35 U.S.C. 154(b) by 17 days.

(21) Appl. No.: 15/616,858

(22) Filed: Jun. 7, 2017

(65) Prior Publication Data
US 2018/0205228 A1    Jul. 19, 2018

(30) Foreign Application Priority Data

Jan. 19, 2017    (KR) .................. 10-2017-0009434

(51) Int. Cl.
*H02J 3/00*    (2006.01)
*H02J 3/18*    (2006.01)
*G01R 21/06*    (2006.01)

(52) U.S. Cl.
CPC .......... *H02J 3/1842* (2013.01); *G01R 21/06* (2013.01)

(58) Field of Classification Search
None
See application file for complete search history.

(56) References Cited

U.S. PATENT DOCUMENTS

| 6,545,887 B2 * | 4/2003 | Smedley | H02J 3/01 363/44 |
|---|---|---|---|
| 8,957,666 B2 | 2/2015 | Dong et al. | |
| 2006/0043941 A1 * | 3/2006 | Fujii | H02J 3/1842 323/207 |
| 2016/0109493 A1 | 4/2016 | Cheng | |

FOREIGN PATENT DOCUMENTS

| JP | 1994-25911 | 4/1994 |
|---|---|---|
| JP | 2013-005694 | 1/2013 |
| JP | 2015108967 | 6/2015 |
| JP | 5754394 | 7/2015 |

(Continued)

OTHER PUBLICATIONS

Korean Office Action with English translation for related Korean Application No. 10-2017-0009434; action dated Jan. 1, 2018; 6 pages.

(Continued)

*Primary Examiner* — Henry Lee, III
(74) *Attorney, Agent, or Firm* — K&L Gates LLP

(57) ABSTRACT

A reactive power compensator includes a plurality of phase clusters each including a plurality of cells, and a controller configured to control the plurality of phase clusters. When an energy error is generated in each of the plurality of phase clusters, the controller performs control to compensate for the energy error by generating an offset signal having a zero sequence component based on an error energy value of each of the plurality of phase clusters.

23 Claims, 10 Drawing Sheets

(56) References Cited

FOREIGN PATENT DOCUMENTS

| KR | 20140087924 A | 7/2014 |
|---|---|---|
| KR | 20150004725 A | 1/2015 |
| KR | 10-1639192 | 7/2016 |

OTHER PUBLICATIONS

IEEE Energy Conversion Congress & Expo 2016, "DC Capacitor Voltage Balancing Control for Delta-Connected Cascaded H-Bridge STATCOM Considering the Unbalance Grid and Load Conditions," Milwaukee, WI, Sep. 21, 2016, 8 pages.

The Transactions of Korean Institute of Power Electronics, "Control of DC-side Voltage Unbalance among Phases in Multi-level H-Bridge STATCOM with Unbalanced Load," vol. 19, No. 4, Aug. 2014, 10 pages.

Korean Intellectual Property Office Application No. 10-2017-0009434, Office Action dated Sep. 25, 2017, 55 pages.

\* cited by examiner

REACTIVE POWER COMPENSATOR AND METHOD OF CONTROLLING THE SAME

CROSS-REFERENCE TO RELATED APPLICATIONS

Pursuant to 35 U.S.C. § 119(a), this application claims the benefit of earlier filing date and right of priority to Korean Patent Application No. 10-2017-0009434, filed on Jan. 19, 2017, the contents of which are all hereby incorporated by reference herein in its entirety.

BACKGROUND

The present disclosure relates to a reactive power compensator and a method of controlling the same.

With the development of industry and the increase in population, a power demand rapidly increases, but there is a limitation in power production.

Therefore, a power system for stably supplying power generated in a production area to a consumer without loss is becoming increasingly more important.

There is a need for a flexible AC transmission system (FACTS) for improving a power flow, a system voltage, and stability. A static synchronous compensator (STATCOM) of the FACTS, which is called a third generation power compensator, is connected in parallel to a power system to compensate for reactive power required by the power system.

FIG. 1 is a diagram illustrating a general power system 10.

As shown in FIG. 1, the general power system 10 may include a power generation source 20, a power system 30, a load 40, and a plurality of reactive power compensators 50.

The power generation source 20 may mean a place or a facility which generates power. The power generation source 20 may be understood as a power producer.

The power system 30 may mean a whole facility including a power line, a steel tower, an arrester, an insulator, and the like, which transmits the power generated in the power generation source 20 to the load 40.

The load 40 may mean a place or a facility which consumes the power generated in the power generation source 20. The load 40 may be understood as a consumer who consumes power.

The reactive power compensators 50 are the STATCOM and are a device that is connected to the power system 30 to compensate for reactive power when the reactive power of power flowing into the power system 30 is low.

The reactive power compensators 50 each include a converter which converts AC power of the power system 30 into DC power or converts DC power into AC power.

The converter includes a cluster with respect to each of three phases, and three phase clusters each including a plurality of cells connected in series to one another.

FIG. 2A is a circuit diagram of a converter having a star connection topology, and FIG. 2B is a circuit diagram of a converter having a delta connection topology.

As shown in FIGS. 2A and 2B, a plurality of cells 54 are connected in series to each of the three phase clusters 52.

In the case of both a converter having a star connection and a converter having a delta connection, in order to secure reliability and excellent operation performance, uniform energy (voltage) control is important between clusters and uniform voltage control is important between cells in each cluster.

In order for the uniform energy control between the clusters, the converter having the star connection uses a zero sequence voltage, and the converter having the delta connection uses a zero sequence current.

An existing uniform control method using a zero sequence voltage has limitations in that control is impossible and a calculation is complicated when a current is not supplied.

In addition, an existing uniform control method using a zero sequence current has limitations in that reliability of uniform control is lowered because a negative sequence component is not considered.

SUMMARY

Embodiments are directed to address the above problems and other problems.

Embodiments provide a reactive power compensator capable of performing uniform control for securing reliability and stability, and a method of controlling the same.

In one embodiment, a reactive power compensator includes: a plurality of phase clusters each including a plurality of cells; and a controller configured to control the plurality of phase clusters, wherein, when an energy error is generated in each of the plurality of phase clusters, the controller performs control to compensate for the energy error by generating an offset signal having a zero sequence component based on an error energy value of each of the plurality of phase clusters.

In another embodiment, a method of controlling a reactive power compensator includes: generating an offset signal having a zero sequence component based on an error energy value of each of a plurality of phase clusters when an energy error is generated in each of the plurality of phase clusters; generating a command value reflecting the offset signal having the zero sequence component; and compensating for the energy error by controlling each of the plurality of phase clusters by using the command value.

DETAILED DESCRIPTION OF THE EMBODIMENTS

Reference will now be made in detail to the embodiments of the present disclosure, examples of which are illustrated in the accompanying drawings.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings.

Figure 1:
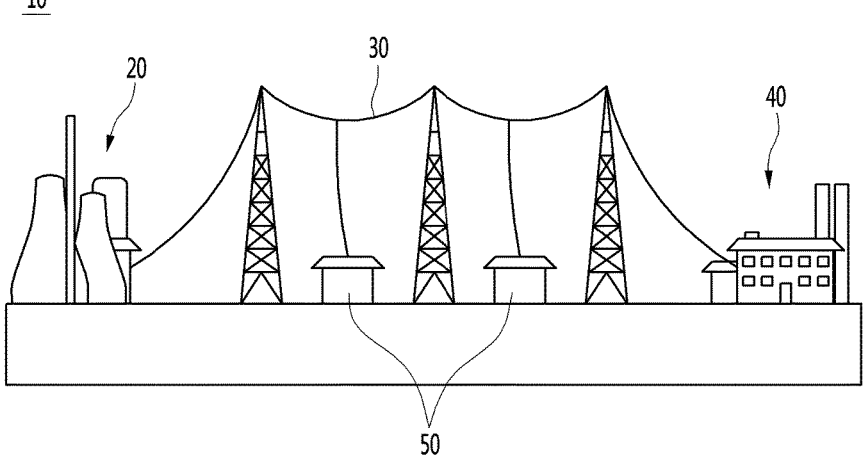
FIG. 1 is a diagram illustrating a general power system.
Figure 2A:
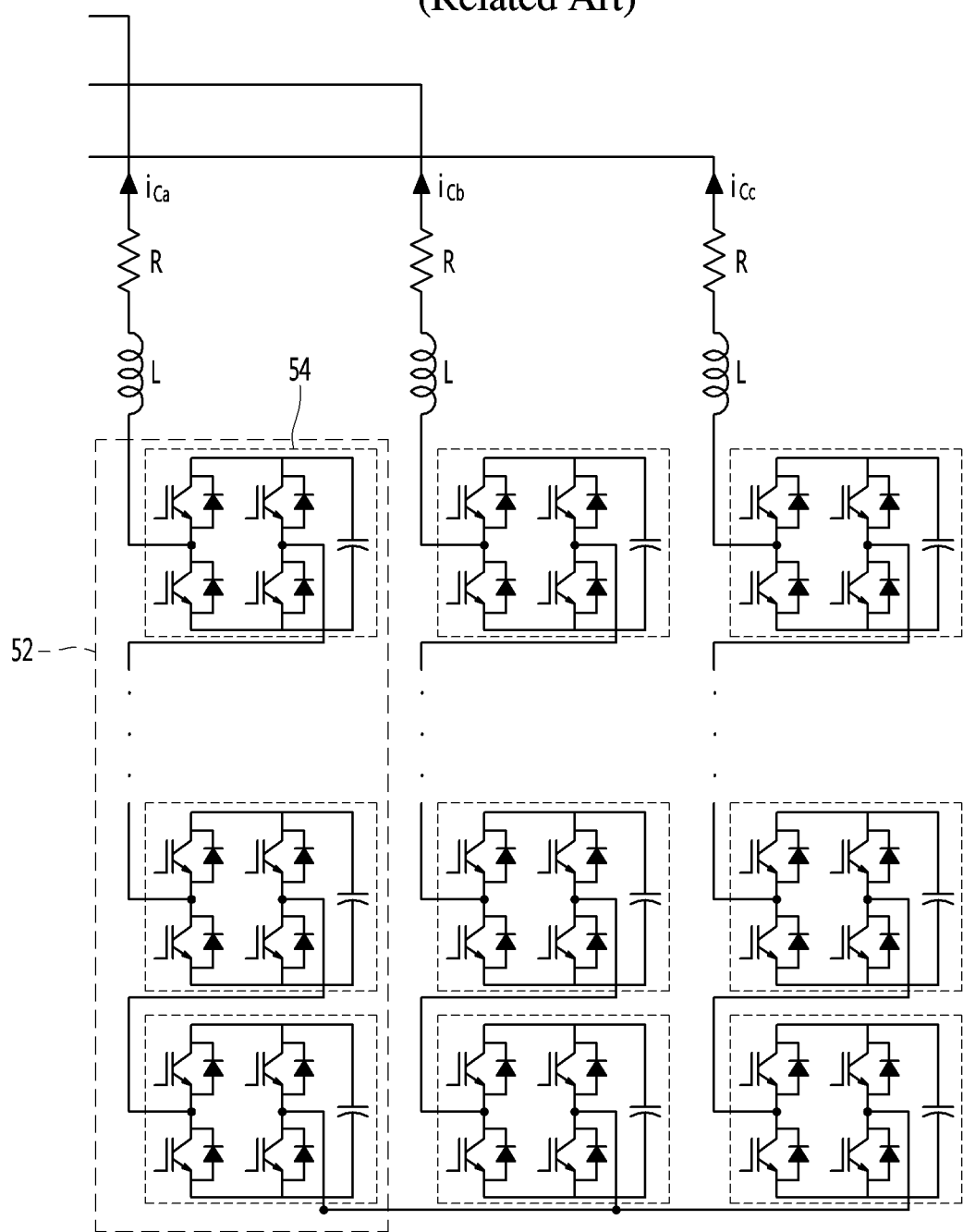
FIG. 2A is a circuit diagram of a converter having a star connection.
Figure 2B:
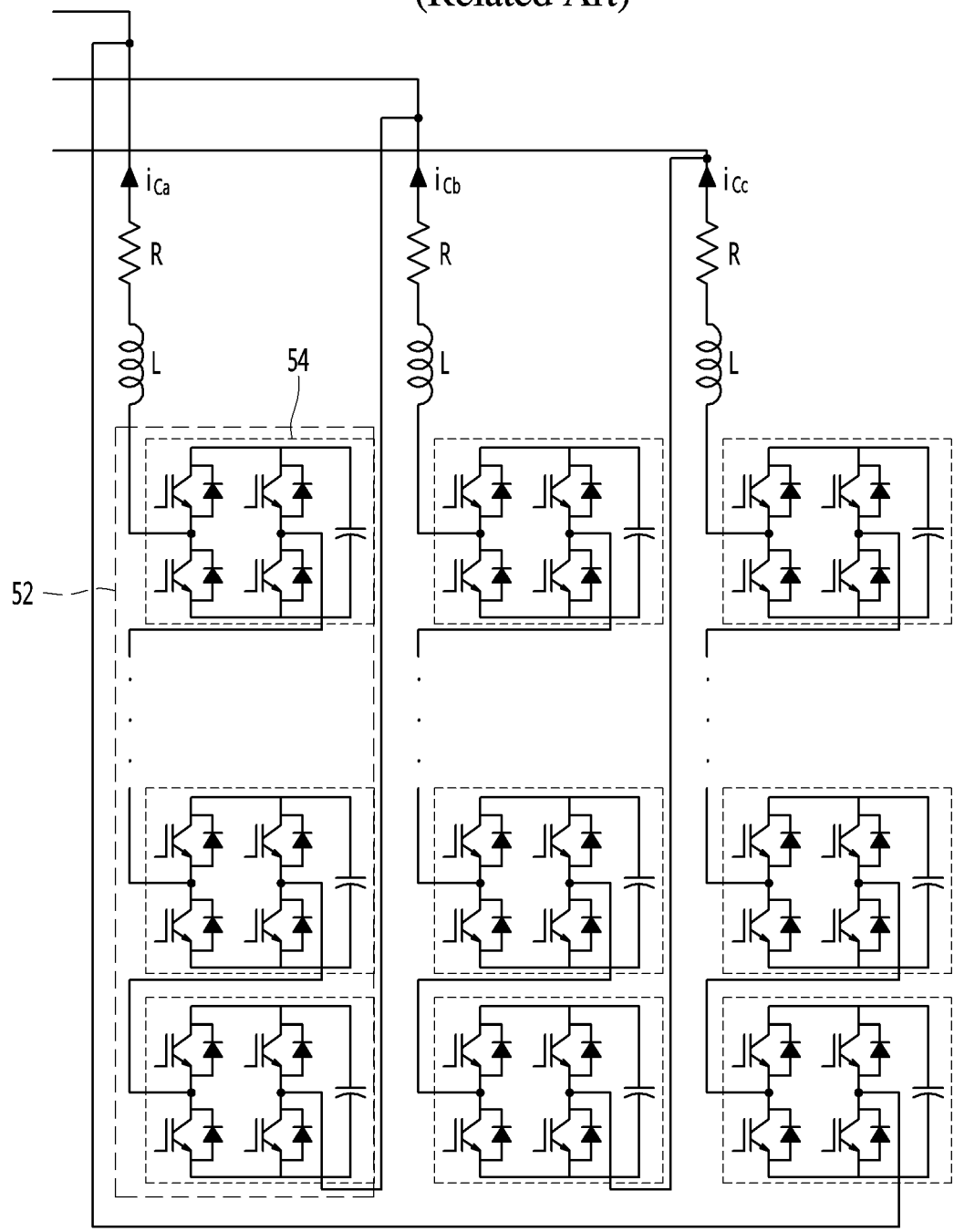
FIG. 2B is a circuit diagram of a converter having a delta connection.
Figure 3:
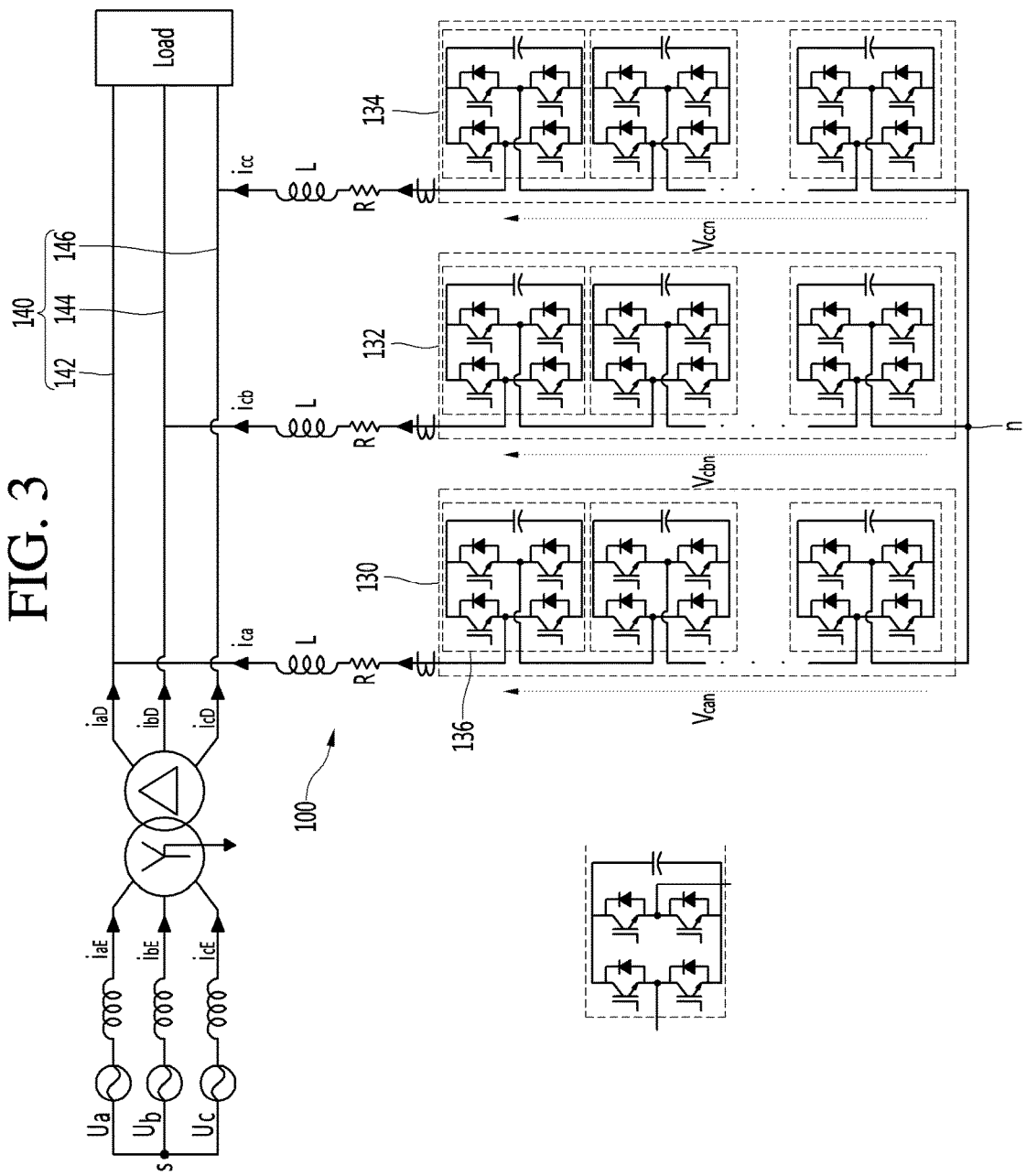
FIG. 3 is a diagram illustrating a power system including a reactive power compensator having a star connection, according to an embodiment.

FIG. 3 is a diagram illustrating a power system including a reactive power compensator 100 having a star connection, according to an embodiment.

As shown in FIG. 3, the reactive power compensator 100 having the star connection may be connected in parallel to a power system 140 to compensate for a reactive power required by the power system 140.

In the reactive power compensator 100 having the star connection, a first phase cluster 130, a second phase cluster 132, and a third phase cluster 134 may be connected to three phase lines 142, 144, and 146 of the power system 140, respectively.

Specifically, the first phase cluster 130 may be connected between the first phase line 142 of the power system 140 and a node n. The second phase cluster 132 may be connected between the second phase line 144 of the power system 140 and the node n. The third phase cluster 134 may be connected between the third phase line 146 of the power system 140 and the node n.

Each of the first, second, and third phase clusters 130, 132, and 134 may include a plurality of cells 136 connected in series to one another. Each of the plurality of cells 136 may include a plurality of switching elements, and a plurality of diodes and a plurality of capacitors, which are connected in parallel to the plurality of switching elements.

When the power system 140 operates, the capacitors may be frequently charged or discharged due to a switching operation of the switching elements in each of the cells 136.

AC reactive power may be generated by the sum of voltages of the capacitors in each cells 136 according to the number of the cells 136 selected or unselected in each of the first, second, and third phase clusters 130, 132, and 134, and the generated AC reactive power may be compensated in the power system 140.

The selecting of the cells 136 may mean that the cells 136 are enabled, that is, the cells 136 are used. The unselecting of the cells 136 may mean that the cells 136 are disabled, that is, the cells 136 are not used.

When the cells 136 are selected, a specific switching element of the plurality of switching elements in the cells 136 is turned on, and thus, a voltage of a capacitor may be output.

When the cells 136 are unselected, a current flow path is not formed in a capacitor in a corresponding cell 136 and the corresponding cell 136 is bypassed. Accordingly, a voltage of the capacitor in the corresponding cell 136 is not output.

As described above, when the first, second, and third phase clusters 130, 132, and 134 constitute the star connection, a voltage across the first phase cluster 130 may be $V_{can}$, a voltage across the second phase cluster 132 may be $V_{cbn}$, and a voltage across the third phase cluster 134 may be $V_{ccn}$.

$V_{can}$, $V_{cbn}$, and $V_{ccn}$ may be represented by Equation 1:

$$v_{can} = -V_m^+ \sin(\omega t) - V_m^- \sin(\omega t + \phi_v^-) - V_0 \sin(\omega t + \phi_0) =$$
$$-V_{ma}\sin(\omega t + \phi_{cva}) - V_0\sin(\omega t + \phi_0)$$

$$v_{cbn} = -V_m^+ \sin\left(\omega t - \frac{2\pi}{3}\right) - V_m^- \sin\left(\omega t + \phi_v^- + \frac{2\pi}{3}\right) -$$
$$V_0\sin(\omega t + \phi_0) = -V_{mb}\sin(\omega t + \phi_{cvb}) - V_0\sin(\omega t + \phi_0)$$

$$v_{ccn} = -V_m^+ \sin\left(\omega t + \frac{2\pi}{3}\right) - V_m^- \sin\left(\omega t + \phi_v^- - \frac{2\pi}{3}\right) -$$
$$V_0\sin(\omega t + \phi_0) = -V_{mc}\sin(\omega t + \phi_{cvc}) - V_0\sin(\omega t + \phi_0),$$

[Equation 1]

wherein $V_m^+$ is an amplitude of a positive sequence component, $V_m^-$ is an amplitude of a negative sequence component, and $V_0$ is an amplitude of a zero sequence component. In addition, $\emptyset_v^-$ may be a phase of the negative sequence component and $\emptyset_0$ may be a phase of the zero sequence component.

Furthermore, each of $V_{ma}$, $V_{mb}$, and $V_{mc}$ may be an amplitude obtained by adding the amplitude $V_m^+$ of the positive sequence component and the amplitude $V_m^-$ of the negative sequence component. Each of $\emptyset_{cva}$, $\emptyset_{cvb}$, and $\emptyset_{cvc}$ may be a phase obtained by adding the phase of the positive sequence component and the phase of the negative sequence component.

Therefore, each of $V_{can}$, $V_{cbn}$, and $V_{ccn}$ may have a waveform of an AC voltage including the amplitude $V_m^+$ of the positive sequence component, the amplitude $V_m^-$ and the phase $\emptyset_v^-$ of the negative sequence component, and the amplitude $V_0$ and the phase $\emptyset_0$ of the zero sequence component.

A current through the first phase cluster 130 may be $i_{ca}$, a current through the second phase cluster 132 may be $i_{cb}$, and a current through the third phase cluster 134 may be $i_{cc}$.

$i_{ca}$, $i_{cb}$, and $i_{cc}$ may be represented by Equation 2:

$$i_{ca} = -I_m^+ \sin(\omega t + \phi_i^+) - I_m^- \sin(\omega t + \phi_i^-) = -I_{ma}\sin(\omega t + \phi_{cia})$$

$$i_{cb} = -I_m^+ \sin\left(\omega t + \phi_i^+ - \frac{2\pi}{3}\right) - I_m^- \sin\left(\omega t + \phi_i^- + \frac{2\pi}{3}\right) =$$
$$-I_{mb}\sin(\omega t + \phi_{cib})$$

$$i_{cc} = -I_m^+ \sin\left(\omega t + \phi_i^+ + \frac{2\pi}{3}\right) - I_m^- \sin\left(\omega t + \phi_i^- - \frac{2\pi}{3}\right) =$$
$$-I_{mc}\sin(\omega t + \phi_{cic}),$$

[Equation 2]

wherein $I_m^+$ is an amplitude of a positive sequence component and $I_m^-$ is an amplitude of a negative sequence component. In addition, $\emptyset_i^+$ may be a phase of the positive sequence component and $\emptyset_i^-$ may be a phase of the negative sequence component.

Furthermore, each of $I_{ma}$, $I_{mb}$, and $I_{mc}$ may be an amplitude obtained by adding the amplitude $I_m^+$ of the positive sequence component and the amplitude $I_m^-$ of the negative sequence component. Each of $\emptyset_{cia}$, $\emptyset_{cib}$, and $\emptyset_{cic}$ may be a phase obtained by adding the phase $\emptyset_i^+$ of the positive sequence component and the phase $\emptyset_i^-$ of the negative sequence component.

Therefore, each of $i_{ca}$, $i_{cb}$, and $i_{cc}$ may have a waveform of an alternating current including the positive sequence component ($I_m^+$ and $\emptyset_i^+$) and the negative sequence component ($I_m^-$ and $\emptyset_i^-$).

In summary, in the first, second, and third phase clusters 130, 132, and 134 constituting the star connection, the voltages $V_{can}$, $V_{cbn}$, and $V_{ccn}$ across the first, second, and third phase clusters 130, 132, and 134 each include all of the positive sequence component ($V_m^+$), the negative sequence component ($V_m^-$ and $Ø_v^-$), and the zero sequence component ($V_0$ and $Ø_0$). However, the currents $i_{ca}$, the $i_{cb}$, and the $i^{cc}$ flowing through the first, second, and third phase clusters 130, 132, and 134 each include only the positive sequence component ($I_m^+$ and $Ø_i^+$) and the negative sequence component ($I_m^-$ and $Ø_i^-$) and do not include a zero sequence current ($I_0$).

On the contrary, as described later, in first, second, and third phase clusters 130, 132, and 134 constituting a delta connection, voltages $V_{ab}$, $V_{bc}$, and $V_{ca}$ across the first, second, and third phase clusters 130, 132, and 134 may each include only a positive sequence component ($V_m^+$ and $Ø_v^+$) and a negative sequence component ($V_m^-$ and $Ø_v^-$) and may not include a zero sequence component, i.e., a zero sequence voltage ($V_0$). However, currents $i_{ca}$, $i_{cb}$, and $i_{cc}$ flowing through the first, second, and third phase clusters 130, 132, and 134 may each include all of a positive sequence component ($I_m^+$ and $Ø_i^+$), a negative sequence component ($I_m^-$ and $Ø_i^-$), and a zero sequence component ($I_0$ and $Ø_0$).

Therefore, in the reactive power compensator 100 including the first, second, and third phase clusters 130, 132, and 134 constituting the star connection, uniform control between the first phase cluster 130, the second phase cluster 132, and the third phase cluster 134 may be performed by using the zero sequence voltage ($V_0$). In the reactive power compensator 100 including the first, second, and third phase clusters 130, 132, and 134 constituting the delta connection, uniform control between the first phase cluster 130, the second phase cluster 132, and the third phase cluster 134 may be performed by using the zero sequence current ($I_0$).

Figure 4:
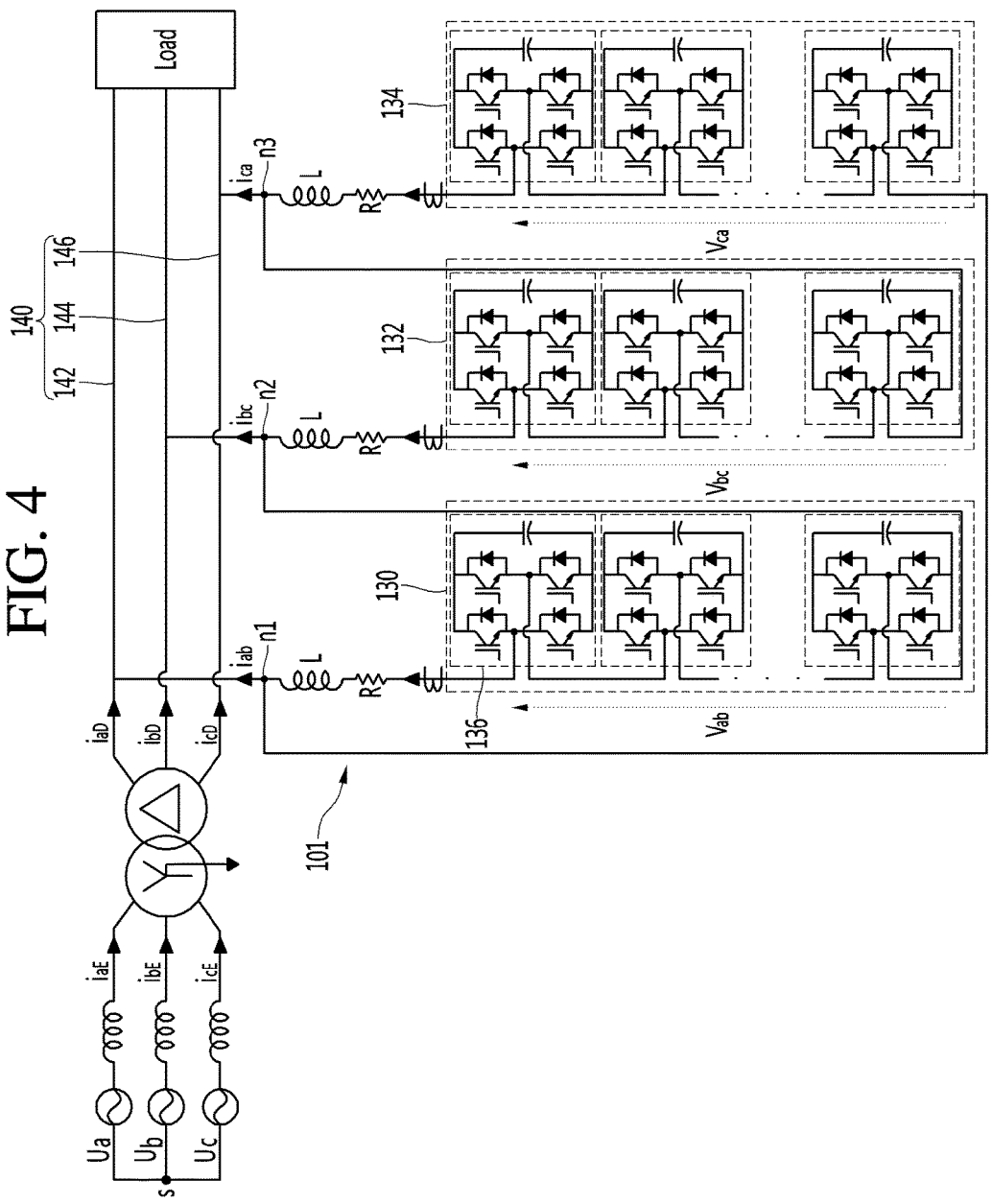
FIG. 4 is a diagram illustrating a power system including a reactive power compensator having a delta connection, according to an embodiment.

FIG. 4 is a diagram illustrating a power system including a reactive power compensator 101 having a delta connection, according to an embodiment.

The reactive power compensator 101 having the delta connection of FIG. 4 has the same configuration as the reactive power compensator 100 having the star connection of FIG. 3, except for a connection structure. Therefore, in the description of the reactive power compensator 101 having the delta connection, the same components as the reactive power compensator 100 having the star connection have the same reference numerals as the reactive power compensator 100.

As shown in FIG. 4, the reactive power compensator 101 having the delta connection may be connected in parallel to a power system 140 to compensate for a reactive power required by the power system 140.

In the reactive power compensator 101 having the delta connection, a first phase cluster 130, a second phase cluster 132, and a third phase cluster 134 may be connected to three phase lines 142, 144, and 146 of the power system 140, respectively.

Specifically, the three phase lines 142, 144, and 146 of the power system 140 may be connected to a first node n1, a second node n2, and a third node n3, respectively.

The first phase cluster 130 may be connected between the first node n1 and the second node n2. The second phase cluster 132 may be connected between the second node n2 and the third node n3. The third phase cluster 134 may be connected between the third node n3 and the first node n1.

The detailed configuration of the first, second, and third phase clusters 130, 132, and 134 constituting the delta connection may be the same as that of the first, second, and third phase clusters 130, 132, and 134 constituting the star connection.

Therefore, a desired waveform of an AC voltage and a desired waveform of an alternating current may be generated according to a selection number of cells 136 in each of the first, second, and third phase clusters 130, 132, and 134.

As described above, when the first, second, and third phase clusters 130, 132, and 134 constitute the delta connection, a voltage across the first phase cluster 130 may be $v_{an}$, a voltage across the second phase cluster 132 may be $v_{bn}$, and a voltage across the third phase cluster 134 may be $v_{cn}$.

$v_{an}$, $v_{bn}$, and $v_{cn}$ may be represented by Equation 3:

$$v_{ab} = -V_m^+\sin(\omega t) - V_m^-\sin(\omega t + \phi_v^-) = -V_{mab}\sin(\omega t + \phi_{cab})$$ [Equation 3]

$$v_{bc} = -V_m^+\sin\left(\omega t - \frac{2\pi}{3}\right) - V_m^-\sin\left(\omega t + \phi_v^- + \frac{2\pi}{3}\right) =$$
$$-V_{mbc}\sin(\omega t + \phi_{cbc})$$

$$v_{ca} = -V_m^+\sin\left(\omega t + \frac{2\pi}{3}\right) - V_m^-\sin\left(\omega t + \phi_v^- - \frac{2\pi}{3}\right) =$$
$$-V_{mca}\sin(\omega t + \phi_{cca}),$$

wherein $V_m^+$ is an amplitude of a positive sequence component and $V_m^-$ is an amplitude of a negative sequence component. In addition, $Ø_v^+$ may be a phase of the positive sequence component and $Ø_v^-$ may be a phase of the negative sequence component.

Furthermore, each of $V_{mab}$, $V_{mbc}$, and $V_{mca}$ may be an amplitude obtained by adding the amplitude $V_m^+$ of the positive sequence component and the amplitude $V_m^-$ of the negative sequence component. Each of $Ø_{cab}$, $Ø_{cbc}$, and $Ø_{cca}$ may be a phase obtained by adding the phase $Ø_v^+$ of the positive sequence component and the phase $Ø_v^-$ of the negative sequence component.

Therefore, each of $v_{ab}$, $v_{bc}$, and $v_{ca}$ may have a waveform of an AC voltage including the positive sequence component ($V_m^+$ and $Ø_v^+$) and the negative sequence component ($V_m^-$ and $Ø_v^-$). At this time, $v_{ab}$, $v_{bc}$, and $v_{ca}$ across the first, second, and third phase clusters 130, 132, and 134 do not include a zero sequence component. This is because the zero sequence component, i.e., a zero sequence voltage ($V_0$) is not present in the delta connection.

A current flowing through the first phase cluster 130 may be $i_{ab}$, a current flowing through the second phase cluster 132 may be $i_{bc}$, and a current flowing through the third phase cluster 134 may be $i_{ca}$.

$i_{ab}$, $i_{ca}$, and $i_{ca}$ may be represented by Equation 4:

$$i_{ab} = -I_m^+\sin(\omega t + \phi_i^+) - I_m^-\sin(\omega t + \phi_i^-) - I_0\sin(\omega t + \phi_0) =$$ [Equation 4]
$$-I_{mab}\sin(\omega t + \phi_{ab}) - I_0\sin(\omega t + \phi_0)$$

$$i_{bc} = -I_m^+\sin\left(\omega t + \phi_i^+ - \frac{2\pi}{3}\right) - I_m^-\sin\left(\omega t + \phi_i^- + \frac{2\pi}{3}\right) -$$
$$I_0\sin(\omega t + \phi_0) = -I_{mbc}\sin(\omega t + \phi_{bc}) - I_0\sin(\omega t + \phi_0)$$

$$i_{ca} = -I_m^+\sin\left(\omega t + \phi_i^+ + \frac{2\pi}{3}\right) - I_m^-\sin\left(\omega t + \phi_i^- - \frac{2\pi}{3}\right) =$$
$$-I_0\sin(\omega t + \phi_0) = -I_{mca}\sin(\omega t + \phi_{ca}) - I_0\sin(\omega t + \phi_0),$$

wherein $I_m^+$ is an amplitude of a positive sequence component, $I_m^-$ is an amplitude of a negative sequence component, and $I_0$ is an amplitude of a zero sequence component. In addition, $\emptyset_i^+$ may be a phase of the positive sequence component, $\emptyset_i^-$ may be a phase of the negative sequence component, and $\emptyset_0$ may be a phase of the zero sequence component.

Furthermore, each of $I_{mab}$, $I_{mbc}$, and $I_{mca}$ may be an amplitude obtained by adding the amplitude $I_m^+$ of the positive sequence component and the amplitude $I_m^-$ of the negative sequence component. Each of $\emptyset_{ab}$, $\emptyset_{bc}$, and $\emptyset_{ca}$ may be a phase obtained by adding the phase $\emptyset_i^+$ of the positive sequence component and the phase $\emptyset_i^-$ of the negative sequence component.

Therefore, each of $i_{ab}$, $i_{bc}$, and $i_{ca}$ may have a waveform of an alternating current including the positive sequence component ($I_m^+$ and $\emptyset_i^+$) and the negative sequence component ($I_m^-$ and $\emptyset_i^-$), and the zero sequence component ($I_0$ and $\emptyset_0$).

According to embodiments as described above, uniform control between the first phase cluster 130, the second phase cluster 132, and the third phase cluster 134 may be performed by extracting an energy error value based on energy caused by a voltage and a current of each of the first, second, and third phase clusters 130, 132, and 134, calculating an offset signal having a zero sequence component based on the extracted energy error value, and reflecting the calculated offset signal having the zero sequence component on driving of the cells 136 in each of the first, second, and third phase clusters 130, 132, and 134 as a compensation signal.

The offset signal may be an offset voltage value of a zero phase component in a structure of the first, second, and third phase clusters 130, 132, and 134 constituting the star connection.

The offset signal may be an offset current value of a zero phase component in a structure of the first, second, and third phase clusters 130, 132, and 134 constituting the delta.

Figure 5:
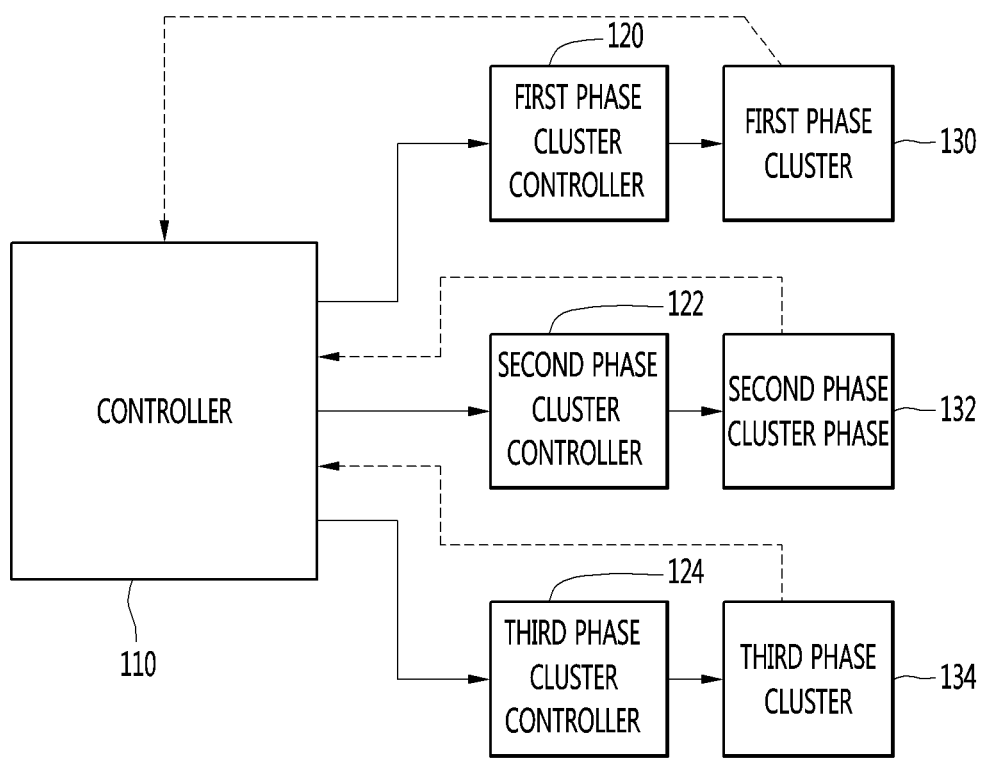
FIG. 5 is a block diagram illustrating a reactive power compensator having a star connection, according to an embodiment.

FIG. 5 is a block diagram illustrating a reactive power compensator 100 having a star connection, according to an embodiment.

Referring to FIG. 5, the reactive power compensator 100 having the star connection according to the embodiment may include a controller 110, first, second, and third phase cluster controllers 120, 122, and 124, and first, second, and third phase clusters 130, 132, and 134.

As shown in FIG. 3, each of the first, second, and third phase clusters 130, 132, and 134 may include a plurality of cells 136 connected in series to one another. Each of the plurality of cells 136 may include a plurality of switching elements, and a plurality of diodes and a plurality of capacitors, which are connected in parallel to the plurality of switching elements As described later, a reactive power compensator 101 having a delta connection may also have the same configuration as in FIG. 5. First, second, and third phase clusters 130, 132, and 134 of the reactive power compensator 101 having the delta connection may have a structure as shown in FIG. 4.

Referring to FIG. 5 again, the first, second, and third phase cluster controllers 120, 122, and 124 may control the first, second, and third phase clusters 130, 132, and 134, respectively.

On the other hand, one phase cluster controller may control the first, second, and third phase clusters 130, 132, and 134, but the present disclosure is not limited thereto.

The first, second, and third phase cluster controllers 120, 122, and 124 may respectively generate first to third switching signals for controlling the first, second, and third phase clusters 130, 132, and 134.

Specifically, the first phase cluster controller 120 may generate the first switching signal for controlling each cell 136 included in the first phase cluster 130. The second phase cluster controller 122 may generate the second switching signal for controlling each cell 136 included in the second phase cluster 132. The third phase cluster controller 124 may generate the third switching signal for controlling each cell 136 included in the third phase cluster 134.

The first, second, and third phase cluster controllers 120, 122, and 124 may generate the first to third switching signals based on a command value and/or a control signal provided by the controller 110.

The controller 110 may control the first, second, and third phase cluster controllers 120, 122, and 124. That is, the controller 110 may generate a command value for controlling the first, second, and third phase cluster controllers 120, 122, and 124.

Specifically, the command value may be generated based on power status information acquired from a power system 140, status information on each of the first, second, and third phase clusters 130, 132, and 134, and/or status information on each cell 136 included in each of the first, second, and third phase clusters 130, 132, and 134 as well as an offset signal having a zero sequence component. The generated command value as described above may be transmitted to the first, second, and third phase cluster controllers 120, 122, and 124.

The status information on each cell 136 in each of the first, second, and third phase clusters 130, 132, and 134 may include information on a fault of each cell 136, voltage information on each cell 136, and so on.

The status information on each of the first, second, and third phase clusters 130, 132, and 134 may be voltage and/or current information. The status information on the first phase cluster 130, the status information on the second phase cluster 132, and the third phase cluster 134 may respectively include, for example, a voltages $v_{can}$ and a current $i_{ca}$, a voltage $v_{cbn}$ and a current $i_{cb}$, and a voltage $v_{ccn}$ and a current $i_{cc}$, which are respectively detected from the first, second, and third phase clusters 130, 132, and 134. However, the present disclosure is not limited thereto.

To this end, a current transformer and/or a potential transformer may be installed in each of the first, second, and third phase clusters 130, 132, and 134.

For example, the controller 110 may generate an offset signal having a zero sequence component based on an energy error with respect to each of the first, second, and third phase clusters 130, 132, and 134, by using a voltage value and a current value detected from each of the first, second, and third phase clusters 130, 132, and 134.

For example, when each of the first, second, and third phase clusters 130, 132, and 134 has no energy error, the offset signal having the zero sequence component becomes zero. It means that energy between the first phase cluster 130, the second phase cluster 132, and the third phase cluster is uniformly maintained.

For example, when the energy error exists, the offset signal having the zero sequence component may be generated in proportional to the energy error. It means that energy between the first phase cluster 130, the second phase cluster 132, and the third phase cluster is non-uniformly maintained.

The offset signal as generated above may be reflected to a command value, and as a result, the respective cells 136 in the first, second, and third phase clusters 130, 132, and 134 may be switched according to the command value to which the generated offset signal is reflected. As the respective cells 136 are switched according to the command value to which the generated offset signal is reflected, the energy error with respect to each of the first, second, and third phase clusters 130, 132, and 134 may be compensated for and thus eliminated. Therefore, energy between the first phase cluster 130, the second phase cluster 132, and the third phase cluster 134 may be uniformly maintained.

The controller 110 may perform wired or wireless communication with the first, second, and third phase cluster controllers 120, 122, and 124. In addition, the first, second, and third phase cluster controllers 120, 122, and 124 may perform wired or wireless communication with the first, second, and third phase clusters 130, 132, and 134, but the present disclosure in not limited thereto.

Figure 6:
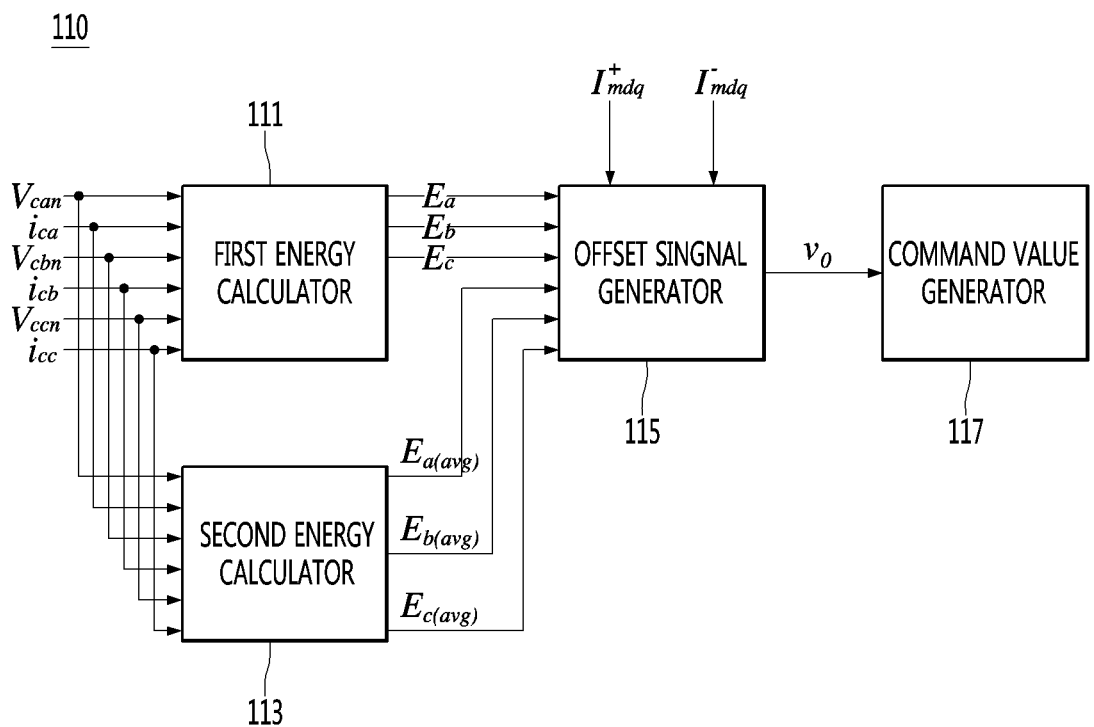
FIG. 6 is a detailed block diagram of a controller.

FIG. 6 is a detailed block diagram of the controller 110.

Referring to FIGS. 5 and 6, the controller 110 may include a first energy calculator 111, a second energy calculator 113, an offset signal generator 115, and a command value generator 117.

The voltage $V_{can}$ and the current $i_{ca}$, the voltage $v_{cbn}$ and the current $i_{cb}$, and the voltage $v_{ccn}$ and the current $i_{cc}$, which are respectively detected from the first, second, and third phase clusters 130, 132, and 134, may be input to the first energy calculator 111 and the second energy calculator 113.

The voltages $v_{can}$, $v_{cbn}$, and $v_{ccn}$ and the currents $i_{ca}$, $i_{cb}$, and $i_{cc}$ may be represented by Equations 1 and 2, respectively.

The first energy calculator 111 may calculate a first energy value $E_a$ of the first phase cluster 130, a second energy value $E_b$ of the second phase cluster 132, and a third energy value $E_c$ of the third phase cluster 134 based on the $v_{can}$, $v_{cbn}$, and $v_{ccn}$ and the currents $i_{ca}$, $i_{cb}$, and $i_{cc}$ in the first, second, and third phase clusters 130, 132, and 134.

That is, the first energy value $E_a$ of the first phase cluster 130, the second energy value $E_b$ of the second phase cluster 132, and the third energy value $E_c$ of the third phase cluster 134 may be calculated by using Equation 5:

$E_a = \frac{1}{2} V_{ma} I_{ma} \cos(\phi_{cva} - \phi_{cia}) + \frac{1}{2} V_0 I_{ma} \cos(\phi_0 - \phi_{cia})$ $E_b = \frac{1}{2} V_{mb} I_{mb} \cos(\phi_{cvb} - \phi_{cib}) + \frac{1}{2} V_0 I_{mb} \cos(\phi_0 - \phi_{cib})$ $E_c = \frac{1}{2} V_{mc} I_{mc} \cos(\phi_{cvc} - \phi_{cic}) + \frac{1}{2} V_0 I_{mc} \cos(\phi_0 - \phi_{cic})$,    [Equation 5]

wherein $E_a$ is an energy value of the first phase cluster 130, $E_b$ is an energy value of the second phase cluster 132, and $E_c$ is an energy value of the third phase cluster 134.

Each of $V_{ma}$, $V_{mb}$, and $V_{mc}$ may be a voltage obtained by adding an amplitude of a positive sequence component and an amplitude of a negative sequence component, and each of $I_{ma}$, $I_{mb}$, and $I_{mc}$ may be a current by adding an amplitude of a positive sequence component and an amplitude of a negative sequence component.

$\emptyset_{cva}$, $\emptyset_{cvb}$, and $\emptyset_{cvc}$ may be a phase obtained by adding a phase of a positive sequence component and a phase of a negative sequence component in the voltage $V_{can}$, a phase obtained by adding a phase of a positive sequence component and a phase of a negative sequence component in the voltage $V_{cbn}$, and a phase obtained by adding a phase of a positive sequence component and a phase of a negative sequence component in the voltage $V_{ccn}$, respectively. $\emptyset_{cia}$, $\emptyset_{cib}$, and $\emptyset_{cic}$ may be a phase obtained by adding a phase of a positive sequence component and a phase of a negative sequence component in the current $i_{ca}$, a phase obtained by adding a phase of a positive sequence component and a phase of a negative sequence component in the current $i_{cb}$, and a phase obtained by adding a phase of a positive sequence component and a phase of a negative sequence component in the current $i_{cc}$, respectively.

$V_0$ may be a voltage corresponding to an amplitude of a zero sequence component, and $\emptyset_0$ may be a phase corresponding to an amplitude of the zero sequence component.

In a normal state, i.e., a state in which energy is uniformly maintained between the first phase cluster 130, the second phase cluster 132, and the third phase cluster 134, the first, second, and third energy values $E_a$, $E_b$, and $E_c$ of the first, second, and third phase clusters 130, 132, and 134 may become zero. Therefore, when an energy error is checked and generated such that the energy is continuously and uniformly maintained, each of the first, second, and third energy values $E_a$, $E_b$, and $E_c$ may be adjusted so as to become zero by using an offset signal having a zero sequence voltage.

The second energy calculator 113 may calculate a first average energy value $E_{a(avg)}$ of the first phase cluster 130, a second average energy value $E_{b(avg)}$ of the second phase cluster 132, and a third average energy value $E_{c(avg)}$ of the third phase cluster 134 based on the voltages $v_{can}$, $v_{cbn}$, and $v_{ccn}$ and the currents $i_{ca}$, $i_{cb}$, and $i_{cc}$ in the first, second, and third phase clusters 130, 132, and 134.

The first, second, and third average energy values $E_{a(avg)}$, $E_{b(avg)}$, and $E_{c(avg)}$ may be represented by Equation 6:

$$E_{a(avg)} = \qquad\qquad\qquad\text{[Equation 6]}$$
$$\langle -V_0 \sin(\omega t + \phi_0)\{-I_m^+\sin(\omega t + \phi_i^+) - I_m^-\sin(\omega t + \phi_i^-)\}\rangle_{avg} =$$
$$\frac{1}{2}V_0 I_m^+ \cos(\phi_0 - \phi_i^-) + \frac{1}{2}V_0 I_m^- \cos(\phi_0 - \phi_i^-)$$

$$E_{b(avg)} = \left\langle -V_0\sin(\omega t+\phi_0)\left\{-I_m^+\sin\left(\omega t+\phi_i^+ - \frac{2\pi}{3}\right)-\right.\right.$$
$$\left.\left. I_m^-\sin\left(\omega t+\phi_i^- + \frac{2\pi}{3}\right)\right\}\right\rangle_{avg} = \frac{1}{2}V_0 I_m^+\cos\left(\phi_0-\phi_i^- + \frac{2\pi}{3}\right)+$$
$$\frac{1}{2}V_0 I_m^-\cos\left(\phi_0-\phi_i^- - \frac{2\pi}{3}\right)$$

$$E_{c(avg)} = \left\langle -V_0\sin(\omega t+\phi_0)\left\{-I_m^+\sin\left(\omega t+\phi_i^+ + \frac{2\pi}{3}\right)-\right.\right.$$
$$\left.\left. I_m^-\sin\left(\omega t+\phi_i^- - \frac{2\pi}{3}\right)\right\}\right\rangle_{avg} = \frac{1}{2}V_0 I_m^+\cos\left(\phi_0-\phi_i^- - \frac{2\pi}{3}\right)+$$
$$\frac{1}{2}V_0 I_m^-\cos\left(\phi_0-\phi_i^- + \frac{2\pi}{3}\right).$$

As represented by Equation 6, the first, second, and third average energy values $E_{a(avg)}$, $E_{b(avg)}$, and $E_{c(avg)}$ may be calculated based on a zero sequence component ($V_0$) of the voltage $V_{can}$ and a positive sequence component ($I_m^+$ and $\emptyset_i^+$) and a negative sequence component ($I_m^-$ and $\emptyset_i^-$) of the current $i_{ca}$, a zero sequence component ($V_0$) of the voltage $V_{cbn}$ and a positive sequence component ($I_m^+$ and $\emptyset_i^+$) and a negative sequence component ($I_m^-$ and $\emptyset_i^-$) of the current $i_{cb}$, and a zero sequence component ($V_0$) of the voltage $V_{ccn}$ and a positive sequence component ($I_m^+$ and $\emptyset_i^+$) and a negative sequence component ($I_m^-$ and $\emptyset_i^-$) of the current $i_{cc}$, respectively.

The offset signal generator 115 may generate an offset signal $v_0$ having a zero sequence component by using the first average energy value $E_{a(avg)}$ of the first phase cluster 130, the second average energy value $E_{b(avg)}$ of the second phase cluster 132, and the third average energy value $E_{c(avg)}$ of the third phase cluster 134.

Specifically, the offset signal generator 115 may generate the offset signal $v_0$ having the zero sequence component by using the first energy value $E_a$ and the first average energy value $E_{a(avg)}$ of the first phase cluster 130, the second energy value $E_b$ and the second average energy value $E_{b(avg)}$ of the second phase cluster 132, and the third energy value $E_c$ and third average energy value $E_{c(avg)}$ of the third phase cluster 134 as well as two phase current values $I_{madq+}$ and $I_{madq-}$.

The two phase current values $I_{madq+}$ and $I_{madq-}$ may be values obtained by performing a two phase transformation on three phase currents, i.e., currents $I_{ma}$, $I_{mb}$, and $I_{mc}$, the current $I_{ma}$ being obtained by adding a positive sequence component and a negative sequence component of the current $i_{ca}$ in the first phase cluster 130, the current $I_{mb}$ being obtained by adding a positive sequence component and a negative sequence component of the current $i_{cb}$ in the second phase cluster 132, and the current $I_{mc}$ being obtained by adding a positive sequence component and a negative sequence component of the current $i_{cc}$ in the third phase cluster 134. The two phase transformation may be performed by a d-q transformation algorithm called a Park's transformation. Since technologies related to the d-q transformation algorithm are widely known, a detailed description thereof will be omitted.

The offset signal generator 115 will be described in more detail with reference to FIG. 7.

Figure 7:
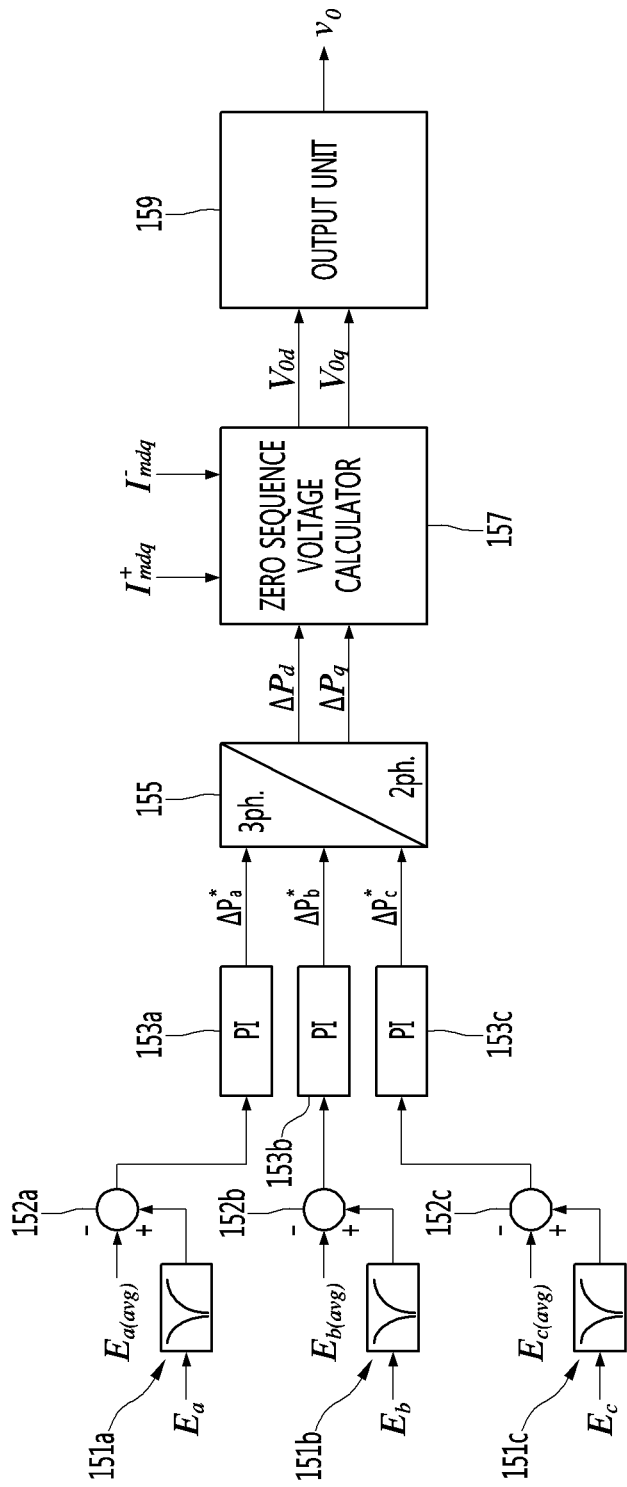
FIG. 7 is a detailed block diagram of an offset signal generator.

FIG. 7 is a detailed block diagram of the off-set signal generator 115.

Referring to FIGS. 5 to 7, the off-set signal generator 115 may include first, second, and third notch filters 151a, 151b, and 151c, first, second, and third error energy calculators 152a, 152b, and 152c, first, second, and third PI controllers 153a, 153b, and 153c, a phase transformation unit 155, a zero sequence voltage calculator 157, and an output unit 159.

The first, second, and third notch filters 151a, 151b, and 151c may be respectively connected to front ends of the first, second, and third error energy calculators 152a, 152b, and 152c and respectively remove specific frequency bands of the first, second, and third energy values $E_a$, $E_b$, and $E_c$ in the first, second, and third phase clusters 130, 132, and 134.

The specific energy band of the first energy value $E_a$ in the first phase cluster 130 may be removed by the first notch filter 151a, and then, the first energy value $E_a$ may be transferred to the first error energy calculator 152a. The specific energy band of the second energy value $E_b$ in the second phase cluster 132 may be removed by the second notch filter 151b, and then, the second energy value $E_b$ may be transferred to the second error energy calculator 152b. The specific energy band of the third energy value $E_c$ in the third phase cluster 134 may be removed by the third notch filter 151c, and then, the third energy value $E_c$ may be transferred to the third error energy calculator 152c.

The first, second, and third notch filters 151a, 151b, and 151c may be omitted.

The first error energy calculator 152a may calculate a first error energy value $\Delta P_a$ corresponding to a difference between the first energy value $E_a$ and the first average energy value $E_{a(avg)}$ of the first phase cluster 130. The second error energy calculator 152b may calculate a second error energy value $\Delta P_b$ corresponding to a difference between the second energy value $E_b$ and the second average energy value $E_{b(avg)}$ of the second phase cluster 132. The third error energy calculator 152c may calculate a third error energy value $\Delta P_c$ corresponding to a difference between the third energy value $E_c$ and the third average energy value $E_{c(avg)}$ of the third phase cluster 134.

The first, second, and third energy error values $\Delta P_a$, $\Delta P_b$, and $\Delta P_c$ as calculated above may be respectively proportional-integral controlled (PI-controlled) by the first, second, and third PI controllers 153a, 153b, and 153c, and then, may be transferred to the phase transformation unit 155.

When there are no first, second, and third energy error values $\Delta P_a$, $\Delta P_b$, and $\Delta P_c$, the first, second, and third energy values $E_a$, $E_b$, and $E_c$ are equal to one another, and thus, an offset signal, which is used to compensate for uniform energy control between the first phase cluster 130, the second phase cluster 132, and the third phase cluster 134, is not calculated.

When at least one energy value of the first, second, and third energy error values $\Delta P_a$, $\Delta P_b$, and $\Delta P_c$ exists, the at least one energy value of the first, second, and third energy error values $\Delta P_a$, $\Delta P_b$, and $\Delta P_c$ is different from other energy values. In this case, an offset signal may be calculated as a compensation signal for the uniform energy control between the first phase cluster 130, the second phase cluster 132, and the third phase cluster 134. Therefore, since the offset signal is reflected to the first, second, and third phase clusters 130, 132, and 134, the first, second, and third energy values $E_a$, $E_b$, and $E_c$ of the first, second, and third phase clusters 130, 132, and 134 may be equal or uniform to one another.

The first PI controller 153a may perform proportional control and integral control on the first error energy value $\Delta P_a$. The second PI controller 153b may perform proportional control and integral control on the second error energy value $\Delta P_b$. The third PI controller 153c may perform proportional control and integral control on the third error energy value $\Delta P_c$.

Since the proportional control and the integral control are widely known, detailed descriptions thereof will be omitted.

While the offset signal generator 115 has been described in embodiments as including the first, second, and third notch filters 151a, 151b, and 151c and/or the first, second, and third PI controllers 153a, 153b, and 153c, the first, second, and third notch filters 151a, 151b, and 151c and/or the first, second, and third PI controllers 153a, 153b, and 153c are options. The first, second, and third notch filters 151a, 151b, and 151c and/or the first, second, and third PI controllers 153a, 153b, and 153c may be or not be included in the offset signal generator 115.

The phase transformation unit 155 may perform a d-q transformation on first, second, and third energy values $\Delta P_a^*$, $\Delta P_b^*$, and $\Delta P_c^*$ input through the first, second, and third PI controllers 153a, 153b, and 153c, and calculate two phase energy values $\Delta P_d$ and $\Delta P_q$. As described above, since the d-q transformation algorithm is widely known, a detailed description thereof will be omitted.

The two phase energy values $\Delta P_d$ and $\Delta P_q$ obtained through the d-q transformation may be transferred to the zero sequence voltage calculator 157.

The zero sequence voltage calculator 157 may calculate two phase zero sequence voltages $V_{0d}$ and $V_{0dq}$ based on the two phase error energy values $\Delta P_d$ and $\Delta P_q$ and two phase current values $I_{mdq}^+$ and $I_{mdq}^-$.

For example, the two phase zero sequence voltages $V_{0d}$ and $V_{0q}$ may be calculated by performing a transformation matrix operation based on the two phase error energy values $\Delta P_d$ and $\Delta P_q$ and the two phase current values $I_{mdq}^+$ and $I_{mdq}^-$.

The output unit 159 may calculate an offset signal $v_0$ including a zero sequence voltage based on the phase zero sequence voltages $V_{0d}$ and $V_{0q}$.

The offset signal $v_0$ including the zero sequence voltage may be related to parameters $V_0$ and $\phi_0$ in Equation 7:

$$v_0 = f(V_0, \phi_0). \qquad \text{[Equation 7]}$$

$V_0$ may be an amplitude of a zero sequence component and $\emptyset_0$ may be a phase of the zero sequence component.

$V_0$ and $\emptyset_0$ may be calculated through Equation 8:

$$V_0 = \sqrt{(V_{0d})^2 + (V_{0q})^2}$$

$$\phi_0 = \tan^{-1}(V_{0q}/V_{0d}). \quad \text{[Equation 8]}$$

When an energy imbalance is generated between the first phase cluster 130, the second phase cluster 132, and the third phase cluster 134, an error may be generated in at least one of the first, second, and third energy values $E_a$, $E_b$, and $E_c$ of the first, second, and third phase clusters 130, 132, and 134, which are respectively calculated through Equation 5. When the error is generated as described above, the offset signal $v_0$ including the amplitude $V_0$ and the phase $\emptyset_0$ of the zero sequence component may be calculated through Equations 7 and 8.

Referring to FIG. 6 again, the offset signal $v_0$ generated by the offset signal generator 115 may be transferred to the command value generator 117.

The command value generator 117 may generate a command value for uniform energy control between the first phase cluster 130, the second phase cluster 132, and the third phase cluster 134 based on the offset signal $v_0$.

The command value may be generated by taking into account the offset signal $v_0$ as well as a state of the power system 140 (for example, a positive sequence component or a negative sequence component of a voltage) or an output state of the reactive power compensator 100 (for example, a positive sequence component or a negative sequence component of a current).

The command value may be transferred to the first, second, and third phase cluster controllers 120, 122, and 124.

The command value generator 117 may individually generate a command value with respect to the first, second, and third phase clusters 120, 122, and 124, but the present disclosure is not limited thereto.

The first, second, and third phase cluster controllers 120, 122, and 124 may respectively generate first to third switching signals for switching the plurality of cells 136 included in the first, second, and third phase clusters 130, 132, and 134, based on the command value.

According to embodiments, when an energy error is generated by checking generation of an error in energy including a positive sequence component, a negative sequence component, and a zero sequence component of each of the first, second, and third phase clusters 130, 132, and 134, the cells 136 in the first, second, and third phase clusters 130, 132, and 134 may be switched according to the command value reflecting the offset signal $v_0$ having the zero sequence component. Accordingly, since energy between the first phase cluster 130, the second phase cluster 132, and the third phase cluster 134 is controlled so as to be uniformly maintained, reliability of a product may be improved.

On the other hand, a process of generating an offset signal $i_0$ in the reactive power compensator 101 having the delta connection is similar to a process of generating the offset signal $v_0$ in the reactive power compensator 100 having the star connection. Therefore, hereinafter, in the description of the reactive power compensator 101 having the delta connection, detailed descriptions of configurations having substantially the same function as in the reactive power compensator 100 having the star connection will be omitted.

Omitted configurations may be easily understood from the reactive power compensator 100 having the star connection described above.

Figure 8:
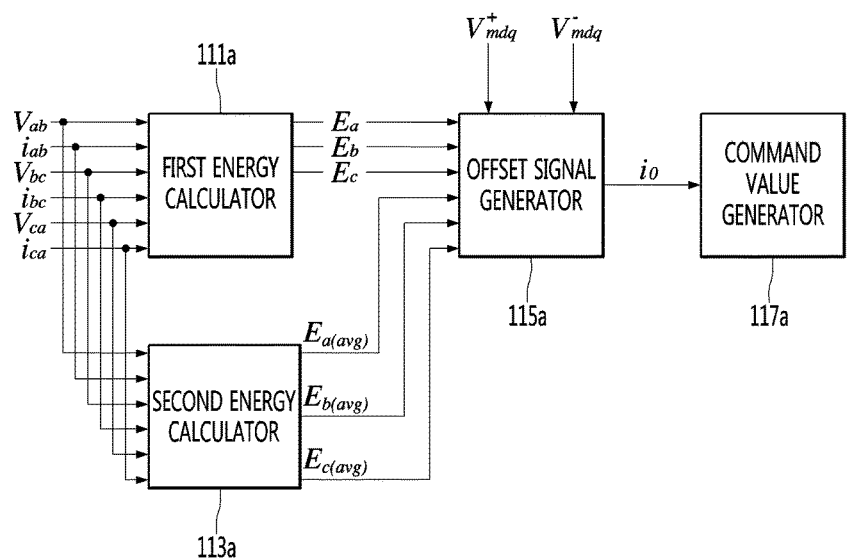
FIG. 8 is a detailed block diagram of an offset signal generator of a reactive power compensator having a delta connection, according to an embodiment.

As shown in FIG. 8, a controller 110A may include a first energy calculator 111a, a second energy calculator 113a, an offset signal generator 115a, and a command value generator 117a.

The first energy calculator 111a may calculate a first energy value $E_a$ of a first phase cluster 130, a second energy value $E_b$ of a second phase cluster 132, and a third energy value $E_c$ of a third phase cluster 134 based on the voltages $v_{ab}$, $v_{bc}$, and $v_{ca}$ represented by Equation 3 and the current $i_{ab}$, $i_{bc}$, and $i_{ca}$ represented by Equation 4. This may be easily understood from Equation 5.

The second energy calculator 113a may calculate first, second, and third average energy values $E_{a(avg)}$, $E_{b(avg)}$, and $E_{c(avg)}$ based on the voltages $v_{ab}$, $v_{bc}$, and $v_{ca}$ and the current $i_{ab}$, $i_{bc}$, and $i_{ca}$. This may be easily understood from Equation 6.

Unlike the star connection, in the reactive power compensator 101 having the delta connection, the first, second, and third average energy values $E_{a(avg)}$, $E_{b(avg)}$, and $E_{c(avg)}$ may be calculated based on positive sequence components and negative sequence components of the voltages $v_{ab}$, $v_{bc}$, and $v_{ca}$ and zero sequence components of the current values $i_{ab}$, $i_{bc}$, and $i_{ca}$, respectively.

The offset signal generator 115a may respectively compare the first energy value $E_a$ of the first phase cluster 130, the second energy value $E_b$ of the second phase cluster 132, and the energy value $E_c$ of the third phase cluster 134 with the first average energy value $E_{a(avg)}$, the second average energy value $E_{b(avg)}$, and the third average energy value $E_{c(avg)}$ and may calculate a first error energy value $\Delta P_a$ corresponding to a difference between the first energy value $E_a$ and the first average energy value $E_{a(avg)}$, a second error energy value $\Delta P_b$ corresponding to a difference between the second energy value $E_b$ and the second average energy value $E_{b(avg)}$, and a third error energy value $\Delta P_c$ corresponding to a difference between the third energy value $E_c$ and the third average energy value $E_{c(avg)}$.

Two phase error energy values $\Delta P_d$ and $\Delta P_q$ may be calculated by performing a two phase transformation on the first, second, and third error energy values $\Delta P_a$, $\Delta P_b$, and $\Delta P_c$ by using a d-q transformation algorithm. Two phase zero sequence currents $I_{0d}$ and $I_{0q}$ may be calculated by matrix-transforming the phase error energy values $\Delta P_d$ and $\Delta P_q$ and two phase voltage values $V_{mdq+}$ and $V_{mdq-}$. An offset signal $i_0$ including a zero sequence current may be calculated based on the two phase zero sequence currents $I_{0d}$ and $I_{0q}$.

For example, the offset signal $i_0$ including the zero sequence current may be related to parameters $I_0$ and $\emptyset_0$ in Equation 9:

$$i_0 = f(I_0, \phi_0). \quad \text{[Equation 9]}$$

$I_0$ is an amplitude of a zero sequence component and $\emptyset_0$ is a phase of the zero sequence component.

$I_0$ and $\emptyset_0$ may be calculated through Equation 10:

$$I_0 = \sqrt{(I_{0d})^2 + (I_{0q})^2}$$

$$\phi_0 = \tan^{-1}(I_{0q}/I_{0d}). \quad \text{[Equation 10]}$$

The command value generator 117a may generate a command value based on the calculated offset signal $i_0$ including the zero sequence current.

Therefore, as a plurality of cells 136 in the first, second, and third phase clusters 130, 132, and 134 are switched according to the generated command value, energy between the first phase cluster 130, the second phase cluster 132, and the third phase cluster 134 may be controlled so as to be uniformly maintained.

Figure 9:
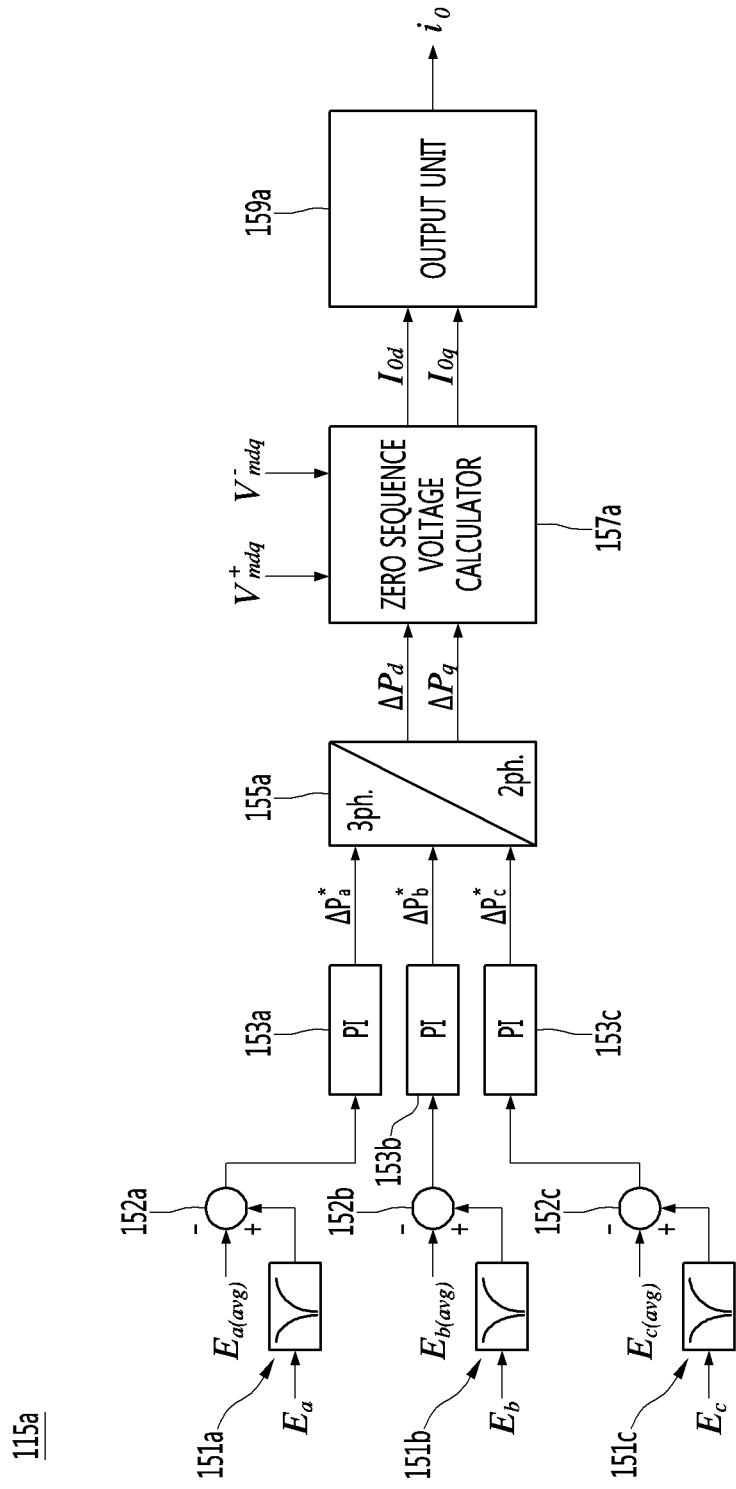
FIG. 9 is a detailed block diagram of an offset signal generator.

The offset signal generator 115a may be illustrated as in FIG. 9. The offset signal generator 115a of the reactive power compensator 101 having the delta connection may be easily understood from FIG. 7. That is, the offset signal generator 115a of FIG. 9 may equally include first, second, and third error energy calculators 152a, 152b, and 152c, first, second, and third PI controllers 153a, 153b, and 153c, and a phase transformation unit 155a, which are substantially the same as shown in FIG. 7.

As shown in FIG. 9, the zero sequence current calculator 157a may calculate two phase zero sequence currents $I_{0d}$ and $I_{0q}$ by matrix-transforming two phase energy values $\Delta P_d$ and $\Delta P_q$ input from the phase transformation unit 155a and two phase voltage values $V_{mdq+}$ and $V_{mdq-}$.

An output unit 159a may calculate an offset signal $i_0$ including a zero sequence current based on the two phase zero sequence currents $I_{0d}$ and $I_{0q}$.

The controlling method described above is a uniform controlling method using feedback control.

Embodiments may include feedback control as well as feedforward control.

The feedforward control may be used to prevent overshooting or a transient phenomenon, which is generable in the feedback control.

In addition, embodiments may use the feedback control and the feedforward control together.

According to at least one of embodiments, when an energy error is generated by checking generation of an error in energy including a positive sequence component, a negative sequence component, and a zero sequence component of each of the first, second, and third phase clusters 130, 132, and 134, cells in the first, second, and third phase clusters 130, 132, and 134 may be switched according to a command value reflecting an offset signal having a zero sequence component. Accordingly, since energy between the first phase cluster 130, the second phase cluster 132, and the third phase cluster 134 is controlled so as to be uniformly maintained, reliability and stability of a product may be improved.

The detailed description is not construed as being limited in all aspects and should be considered as illustrative. The scope of the embodiment should be determined by reasonable interpretation of the appended claims, and all modifications within equivalent ranges of the embodiment are included in the scope of the embodiment.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A reactive power compensator for compensating for reactive power of a power system, the reactive power compensator comprising:
   a plurality of phase clusters, each including a plurality of cells; and
   a controller configured to control the plurality of phase clusters,
   wherein, when an energy error is generated in each of the plurality of phase clusters, the controller performs control to compensate for the energy error by generating an offset signal having a zero sequence component based on an error energy value of each of the plurality of phase clusters.

2. The reactive power compensator of claim 1, wherein, when the plurality of phase clusters constitute a star connection, the offset signal has an offset voltage having a zero sequence component.

3. The reactive power compensator of claim 1, wherein, when the plurality of phase clusters constitute a delta connection, the offset signal has an offset current having a zero sequence component.

4. The reactive power compensator of claim 1, wherein the controller comprises:
   an offset signal generator configured to generate the offset signal having the zero sequence component based on an energy value and an average energy value of each of the plurality of phase clusters; and
   a command value generator configured to generate a command value for compensating for the energy error, based on the offset signal having the zero sequence component.

5. The reactive power compensator of claim 4, wherein the controller further comprises:
   a first energy calculator configured to calculate the energy value of each of the plurality of phase clusters based on a voltage value and a current value of each of the plurality of phase clusters; and
   a second energy calculator configured to calculate the average energy value of each of the plurality of phase clusters based on the voltage value and the current value of each of the plurality of phase clusters.

6. The reactive power compensator of claim 5, wherein the offset signal generator comprises:
   a plurality of error energy calculators, each configured to calculate the error energy value of each of the plurality of phase clusters based on the energy value and the average energy value of each of the plurality of phase clusters;
   a phase transformation unit configured to calculate two phase energy values by performing a two phase transformation on the error energy values of the plurality of phase clusters;
   a zero sequence component calculator configured to calculate two phase zero sequence component values by matrix-transforming the two phase error energy values; and
   an output unit configured to calculate the offset signal having the zero sequence component based on the two phase zero sequence component values.

7. The reactive power compensator of claim 6, wherein the zero sequence component calculator is one of a zero sequence voltage calculator configured to calculate two phase zero sequence voltage values by matrix-transforming the two phase error energy values and two phase current values and a zero sequence current calculator configured to two phase zero sequence current values by matrix-transforming the two phase error energy values and two phase voltage values.

8. The reactive power compensator of claim 6, wherein, when the plurality of phase clusters constitute a star connection, the average energy value of each of the plurality of phase clusters is calculated based on a zero sequence component of the voltage value and a positive sequence component and a negative sequence component of the current value.

9. The reactive power compensator of claim 6, wherein, when the plurality of phase clusters constitute a delta connection, the average energy value of each of the plurality of phase clusters is calculated based on a zero sequence component of the current value and a positive sequence component and a negative sequence component of the voltage value.

10. The reactive power compensator of claim 6, wherein the error energy value of each of the plurality of phase clusters is a difference between the energy value and the average energy value of each of the plurality of phase clusters.

11. The reactive power compensator of claim 7, wherein the two phase current values are values obtained by performing a two phase transformation on the current values of the plurality of phase clusters.

12. The reactive power compensator of claim 7, wherein, when the plurality of phase clusters constitute a star connection, the offset signal having the zero sequence component comprises an amplitude and a phase of a zero sequence voltage.

13. The reactive power compensator of claim 12, wherein the amplitude and the phase of the zero sequence voltage are respectively represented by Equations below:

$V_0 = \sqrt{(V_{0d})^2 + (V_{0q})^2}$ $\phi_0 = \tan^{-1}(V_{0q}/V_{0d})$, wherein $V_0$ is the amplitude of the zero sequence voltage, $\emptyset_0$ is the phase of the zero sequence voltage, and $V_{0d}$ and $V_{0q}$ are two phase sequence voltages.

14. The reactive power compensator of claim 7, wherein, when the plurality of phase clusters constitute a delta connection, the offset signal having the zero sequence component comprises an amplitude and a phase of a zero sequence current.

15. The reactive power compensator of claim 7, wherein the amplitude and the phase of the zero sequence current are respectively represented by Equations below:

$I_0 = \sqrt{(I_{0d})^2 + (I_{0q})^2}$ $\phi_0 = \tan^{-1}(I_{0q}/I_{0d})$, wherein $I_0$ is the amplitude of the zero sequence current, $\emptyset_0$ is the phase of the zero sequence current, and $I_{0d}$ and $I_{0q}$ are two phase sequence currents.

16. A method of controlling a reactive power compensator for compensating for reactive power of a power system, the method comprising:
generating an offset signal having a zero sequence component based on an error energy value of each of a plurality of phase clusters when an energy error is generated in each of the plurality of phase clusters;
generating a command value reflecting the offset signal having the zero sequence component; and
compensating for the energy error by controlling each of the plurality of phase clusters by using the command value.

17. The method of claim 16, wherein the generating of the offset signal having the zero sequence component comprises:
calculating the error energy value of each of the plurality of phase clusters based on an energy value and an average energy value of each of the plurality of phase clusters;
calculating two phase error energy values by performing a two phase transformation on the error energy values of the plurality of phase clusters;
calculating two phase zero sequence component values by matrix-transforming the two phase error energy values; and
calculating the offset signal having the zero sequence component based on the two phase zero sequence component values.

18. The method of claim 17, wherein the calculating of the two phase zero sequence component values comprises calculating two phase zero sequence voltage values by matrix-transforming the two phase error energy values and two phase current values.

19. The method of claim 17, wherein the calculating of the two phase zero sequence component values comprises calculating two phase zero sequence current values by matrix-transforming the two phase error energy values and two phase voltage values.

20. The reactive power compensator of claim 17, wherein, when the plurality of phase clusters constitute a star connection, the average energy value of each of the plurality of phase clusters is calculated based on a zero sequence component of a voltage value and a positive sequence component and a negative sequence component of a current value with respect to each of the plurality of phase clusters.

21. The method of claim 17, wherein, when the plurality of phase clusters constitute a delta connection, the average energy value of each of the plurality of phase clusters is calculated based on a zero sequence component of a current value and a positive sequence component and a negative sequence component of a voltage value with respect to each of the plurality of phase clusters.

22. The method of claim 17, wherein, when the plurality of phase clusters constitute a star connection, the offset signal having the zero sequence component comprises an amplitude and a phase of a zero sequence voltage.

23. The method of claim 17, wherein, when the plurality of phase clusters constitute a delta connection, the offset signal having the zero sequence component comprises an amplitude and a phase of a zero sequence current.

* * * * *